United States Patent [19]

Saho et al.

[11] Patent Number: 5,181,385
[45] Date of Patent: Jan. 26, 1993

[54] CRYOSTAT AND NUCLEAR MAGNETIC RESONANCE IMAGING APPARATUS INCLUDING A CRYOSTAT

[75] Inventors: Norihide Saho, Tsuchiura; Takeo Nemoto, Shimoinayoshi; Mitsuru Saeki, Hitachi, all of Japan

[73] Assignee: Hitachi, Ltd., Tokyo, Japan

[21] Appl. No.: 733,647

[22] Filed: Jul. 22, 1991

[30] Foreign Application Priority Data

Jul. 20, 1990 [JP] Japan .................................. 2-190539

[51] Int. Cl.⁵ .......................................... F25B 19/00
[52] U.S. Cl. ....................................... 62/51.1; 62/297
[58] Field of Search ........................ 62/51.1, 295, 297

[56] References Cited

U.S. PATENT DOCUMENTS

| | | | |
|---|---|---|---|
| 4,510,771 | 4/1985 | Matsuda et al. | 62/51.1 |
| 4,655,045 | 4/1987 | Matsumoto et al. | 62/51.1 |
| 4,689,970 | 9/1987 | Ohguma et al. | 62/51.1 |
| 4,777,807 | 10/1988 | White | 62/51.1 |
| 4,781,034 | 11/1988 | Nicol et al. | 62/297 |
| 4,848,103 | 7/1989 | Pelc et al. | 62/51.1 |
| 4,878,351 | 11/1989 | Weber et al. | 62/51.1 |
| 4,959,964 | 10/1990 | Saho et al. | 62/51.1 |
| 4,986,078 | 1/1991 | Laskaris | 62/51.1 |

FOREIGN PATENT DOCUMENTS

| | | |
|---|---|---|
| 0250675A1 | 1/1988 | European Pat. Off. |
| 359262 | 3/1990 | European Pat. Off. |
| 0359262A2 | 3/1990 | European Pat. Off. |
| 3819542A1 | 12/1988 | Fed. Rep. of Germany |

Primary Examiner—Ronald C. Capossela
Attorney, Agent, or Firm—Antonelli, Terry, Stout & Kraus

[57] ABSTRACT

A magnetically shielded cryostat, e.g. in a MRI imaging apparatus, has a heat-insulating tank having an outer wall. A magnetic shield is spaced from the tank, covers at least partly the outer wall of the tank and is not supported by the tank. A refrigerator having a cooled member extends into the tank. In order to avoid direct transmission of vibration of the refrigerator to a center region of the shield, the refrigerator is supported on the magnetic shield by at least one elongate support member connected to the shield only at or close to the ends of the shield.

20 Claims, 4 Drawing Sheets

CRYOSTAT AND NUCLEAR MAGNETIC RESONANCE IMAGING APPARATUS INCLUDING A CRYOSTAT

BACKGROUND OF THE INVENTION

1. Field of the Invention

The present invention relates to a cryostat provided with a refrigerator and more particularly to a vibration-insulated cryostat housing a superconducting magnet and provided with a refrigerator used in a nuclear magnetic resonance imaging apparatus.

2. Description of the Prior Art

A superconducting magnet (hereafter simply referred to as a magnet) is used for the purpose of obtaining a uniform high magnetic field and is mounted in a cryostat. Such magnets are particularly applicable in a nuclear magnetic resonance imaging instrument for physical diagnosis (hereafter simply referred to as an MRI) used in the medical field. In such apparatus, a vacuum-insulated cryostat which contains a cooled magnet is required. The magnet is cooled by immersing it in a refrigerant at a very low temperature such as liquefied helium in order to maintain the superconducting state. Since liquefied helium is evaporated gradually by the heat entering the cryostat, it is required to replenish the liquefied helium by filling periodically. If the rate of evaporation of the liquefied helium is reduced, the consumption of the liquefied helium is reduced and the operating cost is reduced by a large margin.

To reduce the helium evaporation rate, a refrigerator has been fitted to the cryostat, and the heat entering the vacuum container is absorbed by the refrigerator. Since this refrigerator is generally of an expander type using a reciprocating system, driving sound and impact sound of the piston are produced during operation, which are propagated to the vacuum container of the cryostat, thus generating considerable noise. Examples of support of the refrigerator on the cryostat tank itself are shown in U.S. Pat. No. 4,777,807 and U.S. Pat. No. 4,510,771.

To avoid transmitting noise and vibration to the cryostat tank, it is proposed in EP-A-359262 (corresponding to U.S. Pat. No. 4,959,964) to support the refrigerator on a magnetic shield around the tank. In this case, the refrigerator is supported by fixing it directly to one sheet of a group of magnetic shield sheet members disposed at predetermined intervals around the outer circumference of the cryostat, and the cryostat and the refrigerator are connected airtightly by means of bellows. However, the present inventors have found that, since the refrigerator was fixed at almost a central part of a planar magnetic shield member, the magnetic shield member was easily deformed in a bending direction of its plane due to excitation by vibration of the refrigerator. Therefore, there have been problems that the magnetic shield member itself is resonant with vibration of the refrigerator in a low frequency band. Due to the large vibration amplitude, noise is generated from the magnetic shield members, the vibration is transmitted to the cryostat which is coupled at the lower part of the magnetic shield, and noise is also generated from the cryostat.

If the plate thickness of the magnetic shield member is increased, thereby to make its vibration amplitude small and increase the natural frequency of the magnetic shield member so as to prevent a resonance phenomenon, there is the problem that the weight of the magnetic shield member is increased.

SUMMARY OF THE INVENTION

It is an object of the present invention to provide vibration-isolation for the refrigerator support of a cryostat and to reduce noise generation caused by the operation of the refrigerator, so as to provide a cryostat which is light in weight and low in noise. According to the invention in one aspect there is provided a cryostat having a heat-insulating tank having an outer wall and two opposite ends and a longitudinal direction connecting the ends. A structure, e.g. a magnetic shield, outside the tank at least partly encloses the tank and extends along said tank, the structure comprising one or more sheet members covering the outer wall of the tank and spaced from the outer wall, the structure not being supported by the tank. A refrigerator having a cooled member extends into the tank through the outer wall. This cryostat is characterised in that the refrigerator is mounted on the structure by at least one support member which is connected to the structure at least one location spaced from a central transverse plane of the tank by at least 25% of the length of the tank in the longitudinal direction.

The support member of the refrigerator may be a bar connected to the structure at opposite ends of the bar, or the refrigerator may be connected to the structure directly by a flange of the structure or a flange of the refrigerator.

Where the structure carrying the refrigerator is a magnetic shield, the shield may be cylindrical in shape, or may be formed of flat shield plates.

Preferably the refrigerator is located at a central region of said tank, i.e. closer to the central plane of the tank than the connection point or points of the support member to the structure outside the tank.

It is also preferable that the refrigerator and the outer wall of the cryostat tank are temporarily attached by detachable vibration-isolating coupling means, such as bellows.

In another aspect, the invention consists in a cryostat having a heat insulating tank having an outer wall, and a refrigerator having a cooled member extending into the tank through the outer wall. A first support member for the refrigerator is of bar shape and has opposite ends, the refrigerator being mounted on the first support member away from its ends, and the first support member being spaced from the tank. At least one second support member supports the ends of the first support member, the second support member not being supported by the tank.

In yet another aspect, the invention consists in a magnetically shielded cryostat having a heat-insulating tank having an outer wall and opposite ends. A magnetic shield spaced from the tank around said tank has end members facing the ends of the tank and side members extending between the end members. The shield is supported separately from the tank. A refrigerator having a cooled member extends into the tank through the outer wall thereof. A bar supports the refrigerator at a central location of said tank. The bar is carried at its opposite ends by the end members of the shield.

The invention may further consist in a magnetically shielded cryostat having a heat-insulating tank having an axis and axial ends and being cooled by a refrigerator, and a magnetic shield around the tank supporting the refrigerator. This cryostat is characterised in that the weight of the refrigerator is transmitted to the shield at one or more locations each spaced from a central radial plane of the tank by at least 25% of the axial length of the shield.

The invention is especially applicable to a nuclear magnetic resonance image apparatus having a cryostat tank, a superconducting magnet coil mounted in the cryostat tank and a magnetic shield at least partly surrounding the cryostat tank.

Thus, in a magnetically shielded cryostat, according to the invention, the whole weight of the refrigerator may be supported by fixing a head part of the refrigerator directly or indirectly through support means to the end portions of the shield in a longitudinal direction of the magnetic shield members, which may have a dead weight of several hundred kilograms and more. Accordingly, the natural frequency of the magnetic shield members liable to be excited by the refrigerator vibration is moved to a higher frequency band as compared with the prior art case structure mentioned above. The natural frequency of the support means may also be low, thereby to prevent resonant vibration of the support means. Thus, it is possible to reduce resonance noise of the magnetic shield members and also to reduce noise produced by resonance of the cryostat tank due to the operational vibration of the refrigerator in a low frequency band.

On the other hand, since it is possible to increase the natural frequency of the magnetic shield which is liable to be excited by the refrigerator, without increasing the plate thickness of the magnetic shield members, it is possible to keep the magnetic shield members light in weight.

BRIEF DESCRIPTION OF THE DRAWINGS

Embodiments of the invention will now be described by way of non-limitative example with reference to the accompanying drawings in which.

DESCRIPTION OF THE PREFERRED EMBODIMENTS

Figure 1:
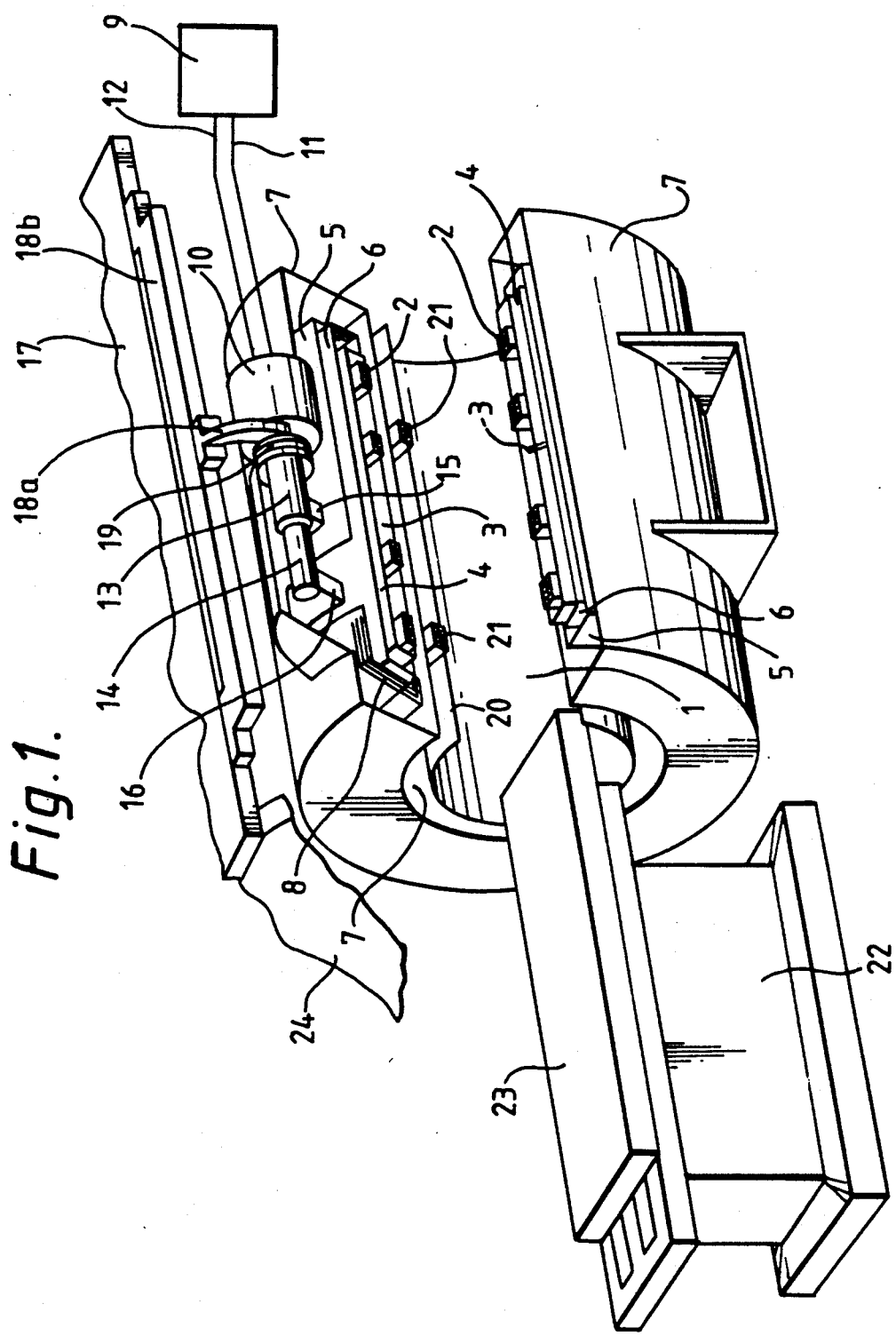
FIG. 1 is a perspective view, partly cut away, of a MRI cryostat provided with magnetic shield and a refrigerator, embodying the present invention.

FIG. 1 shows parts of a MRI apparatus embodying the invention. The principles of MRI imaging are well-known and need not be described here. The apparatus has a generally circularly symmetrical cryostat having an axial cavity 1 communicating with atmospheric air for receiving a patient or other body to be analysed. The cryostat has four annular tanks, one inside another, of which the innermost tank 4 contains liquefied helium 3 which cools a superconductive magnet 2 which provides the required strong magnetic field. Around the tank 4 are two heat-shield vacuum tanks 5 and 6 which are maintained at respective temperature levels, approximately 70K and approximately 15K, in this embodiment. The tank 5 is further insulated by winding round it a laminated insulator 8 and is separated from atmospheric air by means of an outer vacuum container 7. The vacuum spaces inside the outer three tanks 5, 6, 7 intercommunicate. Means for supplying liquid helium to the tank 4 and applying vacuum to the tanks 5, 6, 7 are not shown, but are conventional in this art.

To cool the tanks 5, 6 there is provided a Solvay type refrigerating unit which is composed of a compressor unit 9 as a pressurized gas source (shown diagrammatically), an expander 10 of piston reciprocating type which constitutes a refrigerator, and a high pressure piping 11 and a low pressure piping 12 which communicate between the compressor unit 9 and the expander 10. The cooled low temperature portion of the expander 10 is inserted into outer cryostat tank 7, and has a first stage 13 which is cooled to a temperature of approximately 70K and a second stage 14 which is cooled to a temperature of approximately 15K, thermally connected respectively with the heat-shield sleeves 5 and 6 through flexible heat transfer members 15 and 16 such as copper meshes. Such refrigerating units and their connection to the cryostat tanks are known in the art and need not be described in detail. A vacuum-tight flexible bellows 19 connects the expander 10 to the tank 7, without transmitting vibration.

On the outside of the cryostat tank 7, a magnetic shield which is not supported on the tank 7 and is composed of sheet-shape flat magnetic shield members 17,24 made of iron is installed so as to confine leakage magnetic field within a small space. A top side member 17 and an end member 24 of the shield are partly shown in FIG. 1. There are four side members 17 extending more than the axial length of the tank 7 and two end members 24 (see FIG. 3). The plate thickness of each magnetic shield member is 50 mm or more, and the total weight may reach several tons.

The expander 10 is rigidly fixed to a curved support arm 18a made of stainless steel, and the support arm 18a is rigidly fastened indirectly to the top magnetic shield member 17 by a stainless steel support bar 18b using rigid coupling means such as bolts. As FIG. 1 shows, although the expander 10 is attached via arm 18a to the bar 18b at an axially central region of the tank 7, the bar 18b is connected to the shield member 17 only at two locations close to the respective axial ends of the shield member 17 and tank 7.

A nuclear magnetic resonance high frequency scanning coil 21 which is wound round a bobbin 20 is arranged on the other circumference of the cavity 1, and a slider 23 sliding on a bed 22 is movable into the bobbin 20 carrying a patient or other subject for imaging.

Vibrational movement of the expander 10 is propagated to the two end portions of the magnetic shield member 17 through the support arm 18a and the support bar 18b.

The vibrational frequency f of the magnetic shield member 17 may be expressed as follows:

$$f = \frac{\lambda^2}{2\pi l^2} \sqrt{\frac{EIg}{\gamma A}} \text{ where} \tag{1}$$

$$I = \frac{b}{12} h^3$$

$$A = Wh$$

l is plate length, E is Young's modulus, I is sectional moment of inertia, b is plate width, h is plate thickness, γ is the specific gravity, g is gravitational acceleration and λ=π. As is apparent from the expression (1), the frequency is increased when the plate thickness is made larger and l is made smaller. Therefore, when a support point of the refrigerator is located at the end portions of the member 17 as in the present embodiment, the magnetic shield side member 24 receives most of the operational vibration of the refrigerator. Since the exciting direction is in the direction of the plate plane in the side member 24, the sectional moment of inertia is very large, the vibration amplitude is small, and the frequency f becomes very high. Thus, the vibration amplitude of the whole magnetic shield structure becomes small, and the resonance frequency also becomes high. Therefore, with the support structure of the present embodiment, the vibration amplitude is small, and the natural frequency of the magnetic shield member 17 is at 400 Hz to several thousand Hz thus making the resonance frequency higher as compared with a case in which the support arm 18a is fixed at the central part of the magnetic shield member 17 and not through the support bar 18b and the operational vibration of the expander 10 is received at the central part of the magnetic shield member 17.

In general, the gas switching period of a refrigerating expander is several Hz, and a stepping motor or a synchronous motor is used as the driving motor for gas switching. Thus, the operational frequency arising with such a motor falls within a low frequency band of about 250 Hz. Accordingly, since the resonance frequency of the magnetic shield member 17 and the operational frequency of the expander 10 are spaced from each other by a large margin, the magnetic shield member 17 will not tend to be in resonance due to the operational vibration of the expander 10, and operational noises are not amplified. Thus, the noise level is kept low. Further, since the expander 10 is connected airtightly to the cryostat tank 7 by flexible bellows 19, the operational vibration of the expander is scarcely propagated to the cryostat tank 7.

On the other hand, even if the plate thickness of the magnetic shield member 17 is thin, the natural frequency of the magnetic shield member having an exciting point at the end portion thereof is high. Thus, the plate thickness of the magnetic shield member may be made as thin as possible consistent with the desired magnetic shield effects. Accordingly, it is possible to construct the MRI with light magnetic shield members, thereby making a cryostat provided with a refrigerator and magnetic shield light in weight.

Since the dead weight and the vibrational load of the expander 10 are supported by the rigid magnetic shield member 17 through the support arm 18a and the support bar 18b, the expander shows almost no movement even when the operation load of the expander is applied. Accordingly, since there is no part which vibrates causing a large displacement at the time of operation of the expander, it is possible to provide a highly reliable cryostat in which such problems as vacuum leaks due to cracks produced in the bellows, or cooling performance reduction because of cracks produced in the heat transfer members, do not occur.

Incidentally, in the present embodiment, the expander 10 and the vacuum container 7 are coupled elastically by means of bellows, but low noise may be expected even if they are coupled with a sleeve having a thin wall thickness because vibration may be controlled by the magnetic shield member 17.

Furthermore, similar effects are also obtainable by using a double cylinder type of refrigerator in which helium gas, which is the heat transfer medium, is replenished between the double construction formed with respect to the cylinder.

Figure 2:
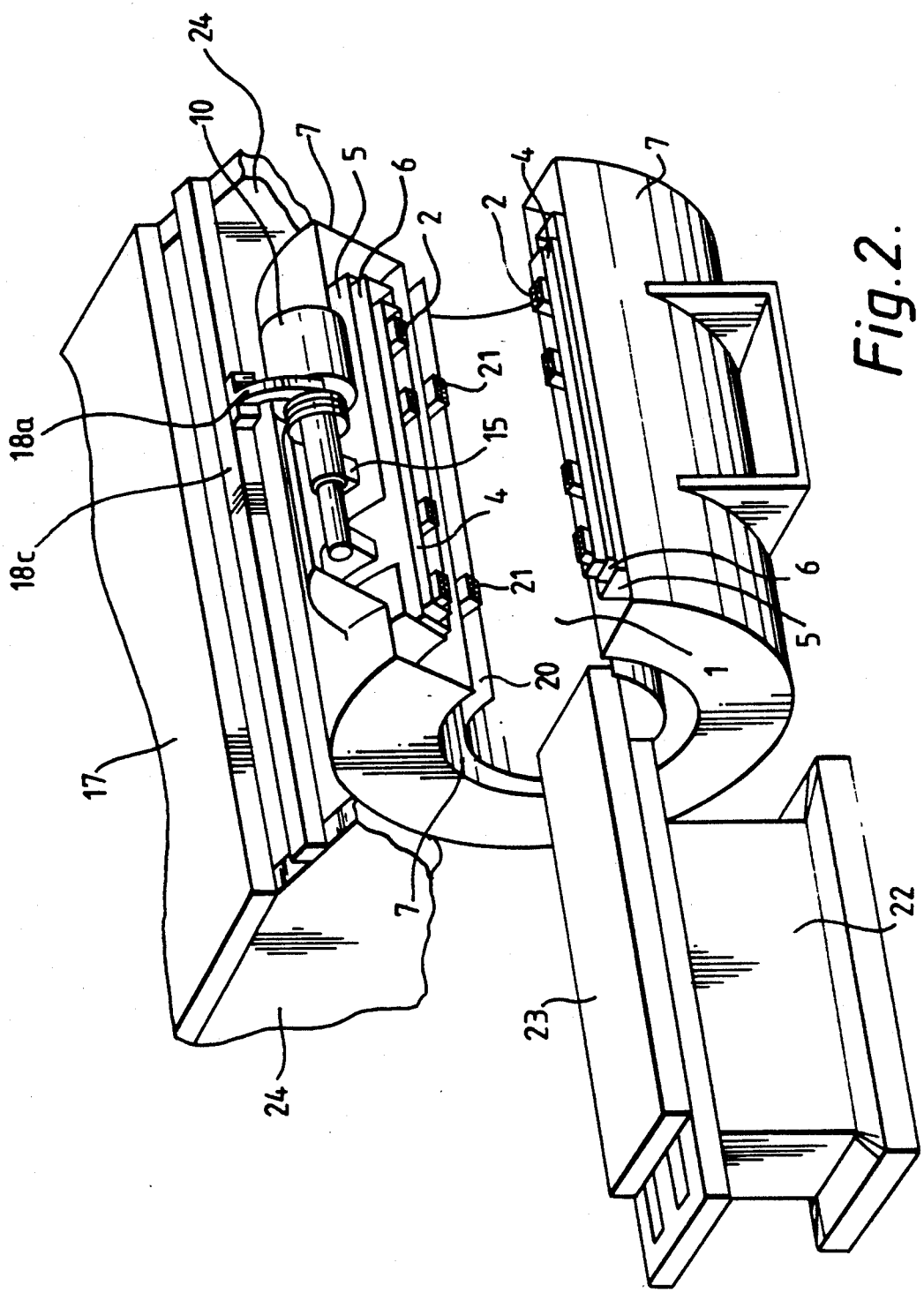
FIG. 2 is a perspective view similar to that of FIG. 1, illustrating another embodiment of the present invention.

FIG. 2 shows another embodiment according to the present invention which is generally similar to that of FIG. 1 but different in that the support arm 18a is fixed to a support bar 18c which is fixed at its opposite ends to outer circumferential portions of the end magnetic shield members 24. With this structure, the resonance frequency of the magnetic shield side member 24 when the support bar 18c is the excitation source becomes even higher. Therefore, the operational vibration of the expander 10 is not amplified and the noise level is lowered further compared even with FIG. 1.

Moreover, since the rigidity of the support bar 18c can be made smaller as compared with the magnetic shield side member 24, the vibration frequency of the support bar 18c can be made very low, so that the support bar 18c will not vibrate resonantly with the operational vibration of the expander 10, and the operational vibration is absorbed into the support bar 18c and reduced while it is propagated to the shield members. Noise can be reduced further effectively when a damping material is used for the support bar 18c or the bar 18c has a vibration-damping structure such as a sandwich construction with a thin rubber layer between two metal plates.

Figure 3:
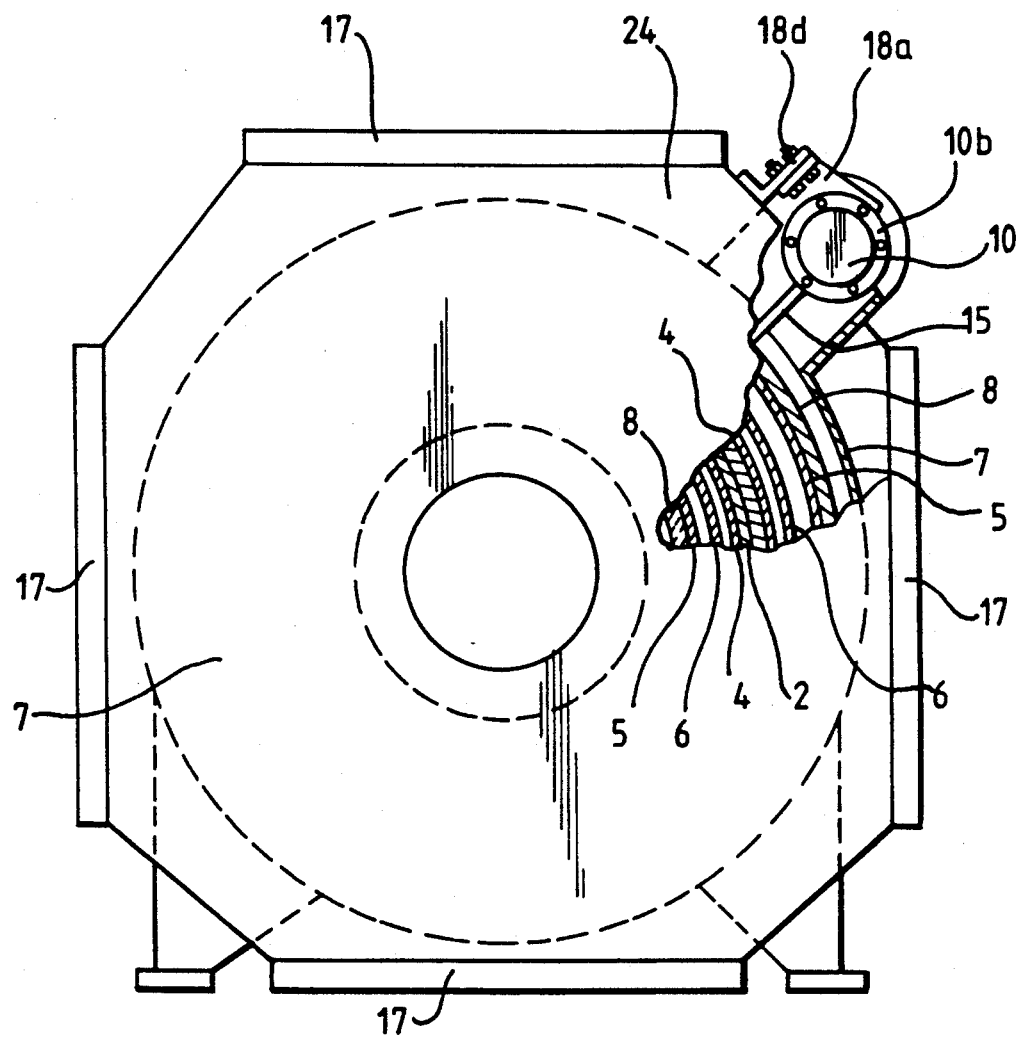
FIG. 3 is a partially sectioned end view of another embodiment of the present invention, very similar to the embodiment of FIG. 2.

FIG. 3 shows another embodiment of the present invention in which a metal support bar 18d (replacing the flat support bar 18c in FIG. 2) is formed of L-section, and the support arm 18a and the expander 10 are joined by bolts through a flange 10b. The support bar 18d is fixed at each end to outer circumferential portions of the magnetic shield end members 24 having an octagonal shape, like the bar 18c of FIG. 2. A L-section bar has high rigidity against bending. Alternatively, other multiple-flange bars may be used, such as I-section, H-section or box-section bars.

The support arm 18a is fastened to the support bar 18d by bolts which are in slot shaped holes, so that the expander 10 can be moved towards or away from the axis of the cryostat tank 7 in order to adjust its position by sliding the support arm 18a on the surface of the support bar 18d after loosening the bolts. In general, the heat shield sleeves 5 and 6 deform by thermal contraction toward the axis of the cryostat tank 7 as the interior of the cryostat cools. Since the heat-shield sleeves 5, 6 are connected with cold stages 13, 14 of the expander 10 through the heat transfer members 15, 16, the heat-shield sleeves 5, 6 are subject to displacement in the direction of thermal contraction. When this displacement occurs, the operation of the expander 10 may become irregular and more noise than at the time of normal operation is produced. Thus, with this embodiment operational noise is prevented from increasing because the expander 10 can be moved to an appropriate position in the radial displacement direction.

Similar effects may be obtained when the magnetic shield member is formed as a cylindrical member, as illustrated next.

Figure 4:
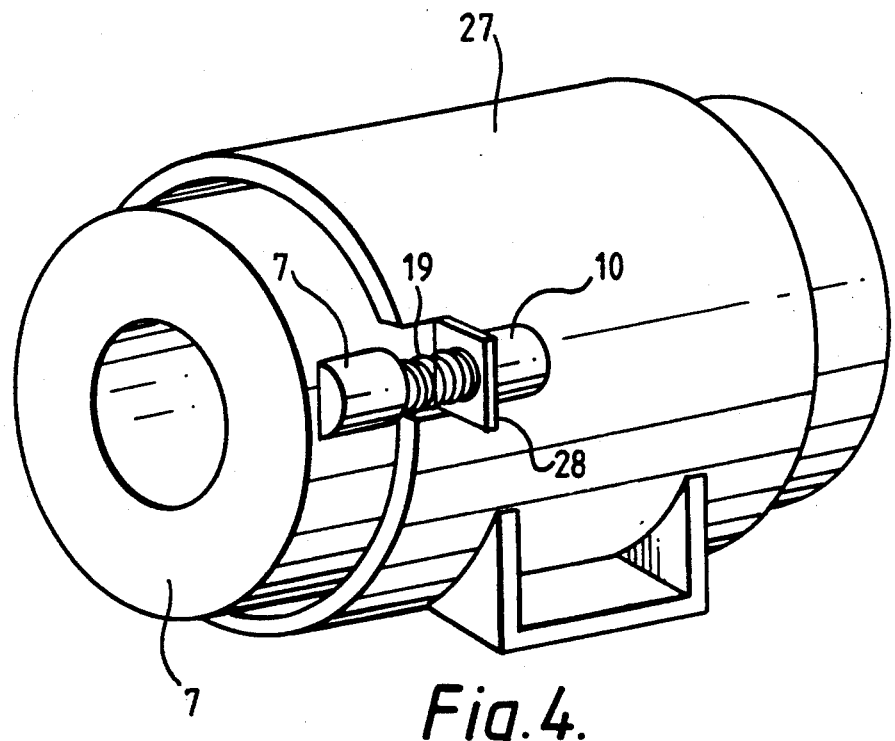
FIG. 4 is a perspective view showing another MRI cryostat embodying the present invention.

FIG. 4 shows another embodiment according to the present invention, which relates to a refrigerator support structure in which cryostat tank 7 is generally as in FIGS. 1 to 3 but the magnetic shield sheet member 27 surrounding the cryostat 7 has a cylindrical shape. A vertical support plate 28 is formed unitarily at one end portion of the shield member 27, and the expander 10 is rigidly fixed to the support plate 28. The expander 10 and a projecting portion of the cryostat tank 7 into which the horizontally extending cooled part of the expander 10 is inserted are connected airtightly by means of bellows 19. Since the vibrational exciting point for vibration from the refrigerator 10 is located at the end portion of the very rigid cylindrical member 27, it is possible to make the excited resonance frequency of the magnetic shield member high so as to be away from the operation frequency of the expander 10, thus minimizing noise generation.

Figure 5:
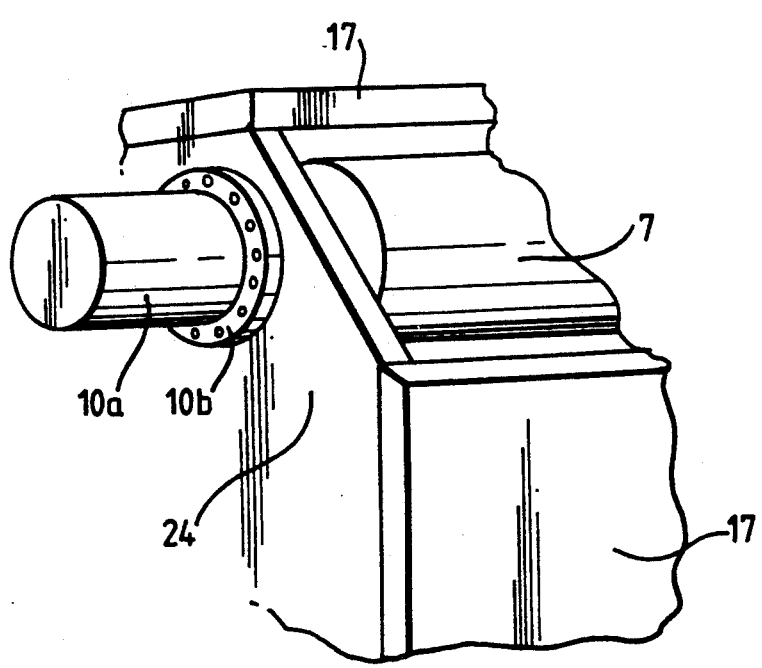
FIG. 5 is a partial perspective view showing part of yet another embodiment of the present invention.

FIG. 5 shows another embodiment according to the present invention, in which the expander 10 is supported by fixing a flange 10b of the expander 10 by bolts directly to the magnetic shield end plate member 24, and the expander 10 and the projecting portion of the cryostat tank 7 receiving the cooled part of the expander are connected airtightly by means of bellows (now shown). Since the operational vibration of the expander 10 acts in a direction perpendicular to the plane of the end plate member 24 in the present embodiment, and the rigidity of this end plate 24 is high, resonant noise caused by operational vibration of the expander 10 may be prevented because the resonance frequency of the plate 24 is high.

As the expander 10, refrigerators of the following types may be used: Gifford-McMahon-cycle, Solvay-cycle, Stirling-cycle, Vuilleumier-cycle, Pulse Tube-cycle. The driving means such as an electric motor may be arranged in a room temperature zone.

In the case of a cryostat which requires no magnetic shield member, low noise effect is also produced when a support member, e.g. one formed of stainless steel or non-magnetic substance, is used as a refrigerator supporting member in the same manner as illustrated.

As is apparent from the above description, the refrigerator and the vacuum container are connected elastically, i.e. non-vibrationally, by means of bellows, and the dead weight and the vacuum pressure load of the refrigerator are transmitted directly or through a support member to an end portion in the longitudinal direction of a massive magnetic shield member arranged outside the cryostat. Thus, the operation frequency of the expander and the natural frequency of the magnetic shield member are not in accord with each other, and the magnetic shield member does not resonate with the operation of the expander, thus making it possible to reduce noise. Furthermore, since the expander can be rigidly fixed, its vibration displacement is small and reliability is high. The excite natural frequency of the magnetic shield member may be set high even if the plate thickness of the magnetic shield member is made thin. Thus, it is possible to provide a magnetically shielded vibration-isolated cryostat which is light in weight.

What is claimed is:

1. A cryostat having
   (a) a heat-insulating tank having an outer wall and two opposite ends and a longitudinal direction connecting said ends,
   (b) a structure at least partly enclosing said tank and extending along said tank said structure comprising one or more sheet members covering said outer wall of said tank and spaced from said outer wall, said structure not being supported by said tank, and
   (c) a refrigerator having a cooled member extending into said tank through said outer wall,
   (d) said refrigerator being mounted on said structure by at least one support member which is connected to said structure at least one location spaced from a central transverse plane of said tank and proximate to an end portion of said one or more sheet members.

2. A cryostat according to claim 1 wherein said structure is a magnetic shield for said tank, composed of at least one said sheet member.

3. A cryostat according to claim 2 wherein said magnetic shield is cylindrical in shape.

4. A cryostat according to claim 2 wherein said magnetic shield is formed of flat shield plates.

5. A cryostat according to claim 1 wherein said refrigerator is located at a longitudinally central region of said tank.

6. A cryostat according to claim 1 wherein said refrigerator is coupled to said outer wall of said tank by flexible vacuum-sealing means.

7. A cryostat according to claim 1 wherein said refrigerator is supported on said structure by means permitting its adjustment in position towards said outer wall of said tank.

8. A cryostat according to claim 1 wherein said refrigerator is supported on said structure via vibration-damping means.

9. A cryostat according to claim 1 wherein said refrigerator is mounted on said structure by a bar extending in said longitudinal direction of said tank and supported on said structure at opposite ends of the bar proximate to end of the one or more sheet members, said refrigerator being connected to said bar at a location intermediate said ends thereof.

10. A cryostat according to claim 1, wherein said at least one support member is disposed at a vertical direction of a plate width of said structure, and said at least one support member has a smaller rigidity than a rigidity at the vertical direction of the plate width of said structure.

11. A cryostat having
    (a) a heat insulating tank having an outer wall,
    (b) a refrigerator having a cooled member extending into said tank through said outer wall,
    (c) a first support member for said refrigerator of bar shape and having opposite ends, said refrigerator being mounted on said first support member away from its said ends, the first support member being spaced from the tank, and
    (d) a structure at least partly enclosing said tank and extending along said tank including at least one second support member supporting said ends of said first support member proximate to end portions of said structure, said second support member not being supported by said tank.

12. A cryostat according to claim 11 wherein said second support member is a sheet-shaped member of a magnetic shield of said tank.

13. A cryostat according to claim 12 wherein said first support member is supported at its opposite ends by two said second support members which are sheet-shaped end members of said magnetic shield.

14. A magnetically shielded cryostat having
    (a) a heat-insulating tank having an outer wall and opposite ends,
    (b) a magnetic shield spaced from said tank around said tank having end members facing said ends of the tank and side members extending between said end members, said shield not being supported by said tank, (c) a refrigerator having a cooled member extending into said tank through said outer wall, (d) a bar supporting said refrigerator at a central location of said tank, said bar being carried at its opposite ends by said end members of the shield.

15. In a magnetically shielded cryostat having (a) a heat-insulating tank having an outer wall comprising opposite ends and at least one side wall connecting said ends, (b) a magnetic shield spaced from the tank and covering at least partly said side wall of said tank, and not supported by said tank, (c) a refrigerator having a cooled member extending into said tank, the improvement that, in order to avoid direct transmission of vibration of said refrigerator to a center region of said shield, said refrigerator is supported on said magnetic shield by at least one support member connected to said shield only at or close to at least one end of the shield.

16. A cryostat according to claim 15 wherein said support member of said refrigerator is a bar extending along said tank and spaced therefrom.

17. A cryostat according to claim 15 wherein said refrigerator has said cooled member extending horizontally into said tank and said support member is vertically extending.

18. In a magnetically shielded cryostat having a heat-insulating tank having an axis and axial ends and being cooled by a refrigerator, and a magnetic shield around said tank supporting said refrigerator, the improvement that the weight of said refrigerator is transmitted to said shield at one or more locations each spaced from a central radial plane of said tank and proximate to end portions the axial length of the shield.

19. A nuclear magnetic resonance image apparatus having a cryostat tank, a superconducting magnet coil mounted in said cryostat tank and having an axis, a magnetic shield at least partly surrounding said cryostat tank and extending in the direction of said axis, a refrigerator for cooling said cryostat tank and support means for supporting said refrigerator on said magnetic shield, said support means being connected to said magnetic shield at least one location spaced axially from said axially central region of said cryostat tank and proximate to an end of said magnetic shield.

20. An apparatus according to claim 19 wherein said support means are connected to said magnetic shield at axial ends thereof.

* * * * *